United States Patent [19]

Nishizawa

[11] Patent Number: 4,968,491
[45] Date of Patent: Nov. 6, 1990

[54] APPARATUS FOR PERFORMING EPITAXIAL GROWTH OF ZNSE CRYSTAL FROM MELT THEREOF

[75] Inventor: Jun-ichi Nishizawa, Sendai, Japan

[73] Assignee: Zaidan Hojin Handotai Kenkyu Shinkokai, Sendai, Japan

[21] Appl. No.: 91,304

[22] Filed: Aug. 25, 1987

Related U.S. Application Data

[60] Continuation of Ser. No. 759,442, Jul. 26, 1985, abandoned, which is a division of Ser. No. 513,294, Jul. 13, 1983, Pat. No. 4,572,763.

[30] Foreign Application Priority Data

Jul. 14, 1982 [JP] Japan ................. 57-123696

[51] Int. Cl.$^5$ ............................. F30B 35/00
[52] U.S. Cl. ............................. 422/247; 422/250; 422/253
[58] Field of Search ........ 156/621, 622, 624, DIG.72, 156/DIG. 77; 422/248, 250, 253

[56] References Cited

U.S. PATENT DOCUMENTS

| | | | |
|---|---|---|---|
| 3,374,067 | 3/1968 | Johnson et al. | 156/624 |
| 3,796,548 | 3/1974 | Boss et al. | 422/248 |
| 4,315,796 | 2/1982 | Nishizawa | 156/614 |

FOREIGN PATENT DOCUMENTS

| | | |
|---|---|---|
| 3123233 | 4/1982 | Fed. Rep. of Germany . |
| 3237536 | 4/1983 | Fed. Rep. of Germany . |
| 57-77098 | 5/1982 | Japan . |

OTHER PUBLICATIONS

Patents Abstracts of Japan, C-108, Jun. 16, 1982, vol. 6/No. 106.
Patents Abstracts of Japan, C-120, Aug. 19, 1982, vol. 6/No. 158.
Patents Abstracts of Japan, C-149, Feb. 4, 1983, vol. 7/No. 28.

Primary Examiner—John Doll
Assistant Examiner—R. Bruce Breneman
Attorney, Agent, or Firm—Cushman, Darby & Cushman

[57] ABSTRACT

In conducting a liquid phase epitaxial growth of a Zn crystal on a substrate wherein a batch of Se melt serving as a solvent is used and relying on a vapor pressure controlling technique and a temperature difference method, a Zn vapor pressure controlling region is disposed, via the Se melt, in a direction vertical to the surface of the substrate which is contained in the growth region, and a ZnSe source crystal is disposed in such a way that it is supplied into the Se melt in a lateral direction of this melt. Whereby, a ZnSe single crystal having a good cyrstal perfection, and a good linearity of the thickness of the grown crystal relative to time can be obtained.

6 Claims, 4 Drawing Sheets

APPARATUS FOR PERFORMING EPITAXIAL GROWTH OF ZNSE CRYSTAL FROM MELT THEREOF

This is a continuation of application Ser. No. 759,442, filed July 26, 1985, which was abandoned upon the filing hereof, which was a division of application Ser. No. 513,294, filed July 13, 1983, now U.S. Pat. No. 4,572,763, issued Feb. 25, 1986.

BACKGROUND OF THE INVENTION (a) Field of the Invention

The present invention pertains to an apparatus of performing an epitaxial growth of Group II–VI compound semiconductor crystals, and more particularly it relates to an apparatus of performing an epitaxial growth of ZnSe crystals from a solution thereof.

(b) Description of the Prior Art

Many of Group II–VI compound semiconductor crystals such as ZnS, ZnSe and CdS have energy band gaps greater than those of Group III–V compound semiconductor crystals, and also they are such crystals that the transition of carriers is of the direct transition type. Especially, a ZnSe crystal has an energy band gap of 2.67 eV at room temperature, and accordingly it is a crystal of which research is being made widely as one of noteworthy materials for obtaining LEDs (light-emitting diodes) having emission spectra in the wavelength region (450–490 nm) of purely blue color, which cannot be realized with Group III–V compound semiconductors.

Many of ZnSe compound semiconductor crystals (hereinafter to be abbreviated as ZnSe crystals) are obtained by relying on a melt growth at a high temperature which is typically represented by the Bridgman method. Most of those ZnSe crystals which are obtained by relying on the prior growth method have usually been of the n-type conductivity having a high resistivity. No satisfactory p-type crystal could have been obtained in the past even by doping a p-type impurity into the crystal during the crystal growth process.

Accordingly, while the useful properties of the ZnSe crystal have been appreciated, the technology has not developed so far as to provide a diode to serve as an LED having a satisfactory pn junction.

The reasons are that, during the crystal growth process, in view of the fact that the vapor pressure of a component element Se is much higher than the vapor pressure of the other component element Zn, there develops a deviation from stoichiometry of the crystal being grown, i.e. there develops Se vacancies due to the shortage of the Se element, which Se vacancies act as donors; or even in case a p-type impurity is doped into the crystals being grown, there develops a complex of the Se vacancies and the doped impurity to serve as donors.

Relatively recently, the present inventor has proposed a very effective crystal growth method which eliminates these causes mentioned above, as disclosed in Japanese Patent Preliminary Publication No. Sho 57-183400 translation filed May 9, 1984 entitled "A method and an apparatus for effecting liquid phase growth of II–VI compounds"; Japanese Patent Application No. Sho 56-161837 entitled "Group II–VI compound semiconductor devices"; and Japanese Patent Application No. Sho 57-115893 entitled "A method of growing ZnSe crystals" which forms the basis of Nishizawa U.S. application Ser. No. 509,053 filed June 29, 1983.

This earlier proposed method is such that a component Se element having a high vapor pressure is used as a solvent in a melt in which is doped a p-type impurity selected from Group Ia elements such as Li, Na and K or from Group Ib elements such as Au, Ag and Cu, and that, throughout the growth process, the vapor of the Zn element having a lower vapor pressure than the Se element is supplied onto the surface of the melt, and also that throughout the growth process there is established a constant temperature difference between the region in which recrystallization takes place and the region of the source crystals.

Thanks to this method, it has become possible to obtain, stably, a bulk crystal of the p-type having a good crystal perfection, which, in turn, has brought about a drastic improvement in the technique of fabricating pn junction semiconductor devices.

For example, a crystal which has been obtained by the above-mentioned technique is rinsed in a Zn solution by keeping the crystal therein at, for example, 1000° C., and thereafter subjecting it to a heat treatment for one hour or more, Zn will diffuse into the crystal from its surface to a depth of several tens of micrometers so that the conductivity type of the crystal which has been of the p-type changes into the n-type upto said depth, and thus a pn junction can be formed. According to this method of forming a pn junction by diffusion, however, there arises a deviation from stoichiometry of the crystal in the vicinity of the crystal surface, bringing about the generation of such defects as point defects, which lowers the crystal perfection of the product. As such, even when there is used a good crystal substrate in this earlier method, there has been the drawback that, when an LED device is fabricated with such a crystal, the resulting device will exhibit a lowered efficiency of light emission.

For the foregoing reasons, the present inventor has earlier proposed, in Japanese Patent Application No. Sho 57-115894 entitled "ZnSe Blue Light Emitting Diode", based on the discovery that, as a method for forming a pn junction while keeping a good crystal condition of the substrate crystal without degrading its good crystal perfection, the crystal growth relying on the epitaxial growth technique is the optimum, and that, especially, it is desirable to use, as a substrate, an n-type ZnSe crystal and to perform an epitaxial growth of a p-type crystal on top of this n-type crystal.

The conventional typical crystal growth apparatus which is used in performing an epitaxial growth of a ZnSe crystal is shown in FIGS. 1(a) and (b). That is, an ampule 5 which is employed for the growth is given a horizontal structure. In a growth region 12 is set a substrate 13 made of a single ZnSe crystal and having, for example, a diameter of about 6 to 8 mm and a thickness of about 500 μm. In the stage prior to growth, the ampule 5 is tilted in such manner as shown in FIG. 1(a), and in this state Se 14 which serves as the solvent and ZnSe source crystals 15 are charged in the source crystal region 16, and subjecting them to an alloying condition by keeping them in the melt state for example at 900° C. for 1 to 3 hours. Thereafter, the ampule 5 is positioned to assume a horizontal posture as shown in FIG. 1(b), so that the substrate 13 is rinsed in the Se melt 14, to thereby perform a crystal growth thereon. In this case, the amount of the ZnSe source crystals which are charged in the Se melt is set to be greater than the amount in which the melt becomes a saturated solution, so that ZnSe source crystals are present in the melt also during the growth process.

Since Se has a density of 4.80 g/cm$^3$ and ZnSe has a density of 5.98 g/cm$^3$, ZnSe source crystals will sink into the Se melt. Accordingly, in case the ampule has a vertical type structure, ZnSe crystals will naturally sink downwardly prior to the dissolving of the ZnSe source crystals in such an Se melt as that described above. Accordingly, even when the position of the ampule is changed to the horizontal posture to thereby render the melt to a saturated solution, it will be noted that, when it is intended to bring the ampule into its vertical posture to perform a growth, the remaining ZnSe source crystals will tend to sink downwardly. Therefore, in this particular respect, the growth apparatus which is composed principally of the ampule had better be set horizontal to provide the advantage such that those ZnSe molecules which have dissolved into the Se melt in the source crystal region 16 are transported so as to be supplied, in a constant condition, into the growth region 12.

In this horizontal type growth apparatus, however, it will be noted that, owing to the need for establishing a temperature difference between the growth region 12 and the source crystal region 16 throughout the growth process, it becomes difficult to keep a uniform temperature at the entire surface of the substrate throughout the growth process. Another structural disadvantage that it is difficult to establish a temperature difference in a vertical direction to the substrate. In this respect, a vertical type growth apparatus structure is desirable.

SUMMARY OF THE INVENTION

It is, therefore, the object of the present invention to provide a method and an apparatus for performing an epitaxial growth of a ZnSe crystal from a melt thereof, which allows one to obtain an epitaxial layer having a good crystal perfection on a substrate, by using a vertical type growth apparatus using Se which is a component element having a higher vapor pressure than Zn to serve as a solvent, and performing a crystal growth while establishing a constant temperature difference between the substrate and the source crystals and under the so-called controlled vapor pressure by which the vapor of Zn which is the other component element having a lower vapor pressure is supplied constantly to said solvent throughout the growth process, wherein only the above-described advantage of the horizontal type growth apparatus structure is utilized, thereby eliminating the abovesaid drawback of the vertical type.

BRIEF DESCRIPTION OF THE DRAWINGS

FIGS. 1(a) and 1(b) show examples of conventional horizontal type quartz ampule structures used in the past in performing an epitaxial growth of a crystal by relying on the temperature difference technique, in which:

(a) shows the structure for the alloying process, and
(b) shows the structure for the growth process.

Figure 1A:
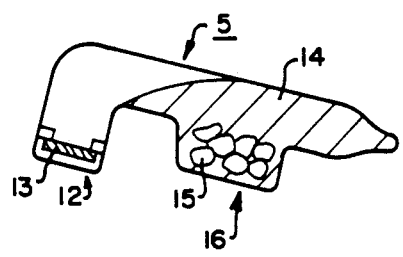
Figure 1B:
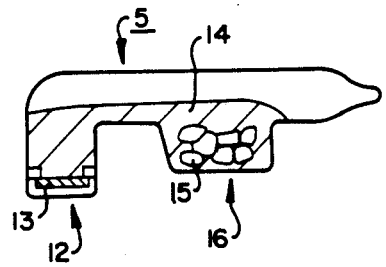
Figure 2:
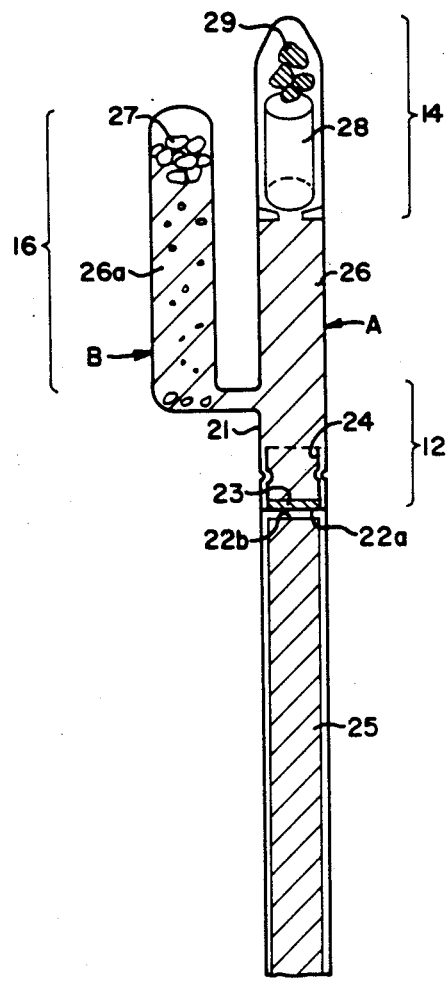

FIG. 2 is an example of a quartz ampule structure of the vertical type used for performing an epitaxial growth according to the present invention relying on the temperature difference method under controlled vapor pressure.

Figure 3:
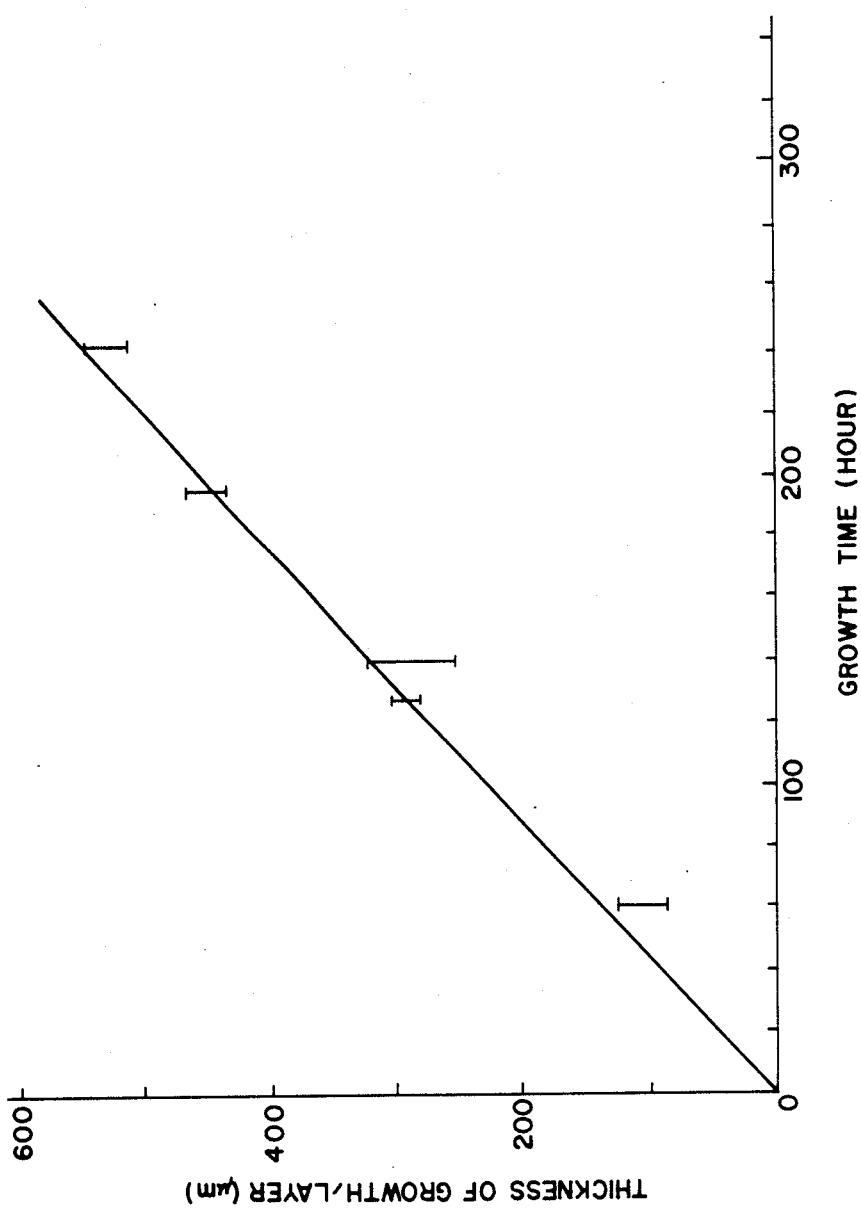

FIG. 3 is a diagram showing the relationship between the thickness and the growth time of an epitaxially grown layer of ZnSe crystal obtained by using the growth apparatus of the present invention.

Figure 4:
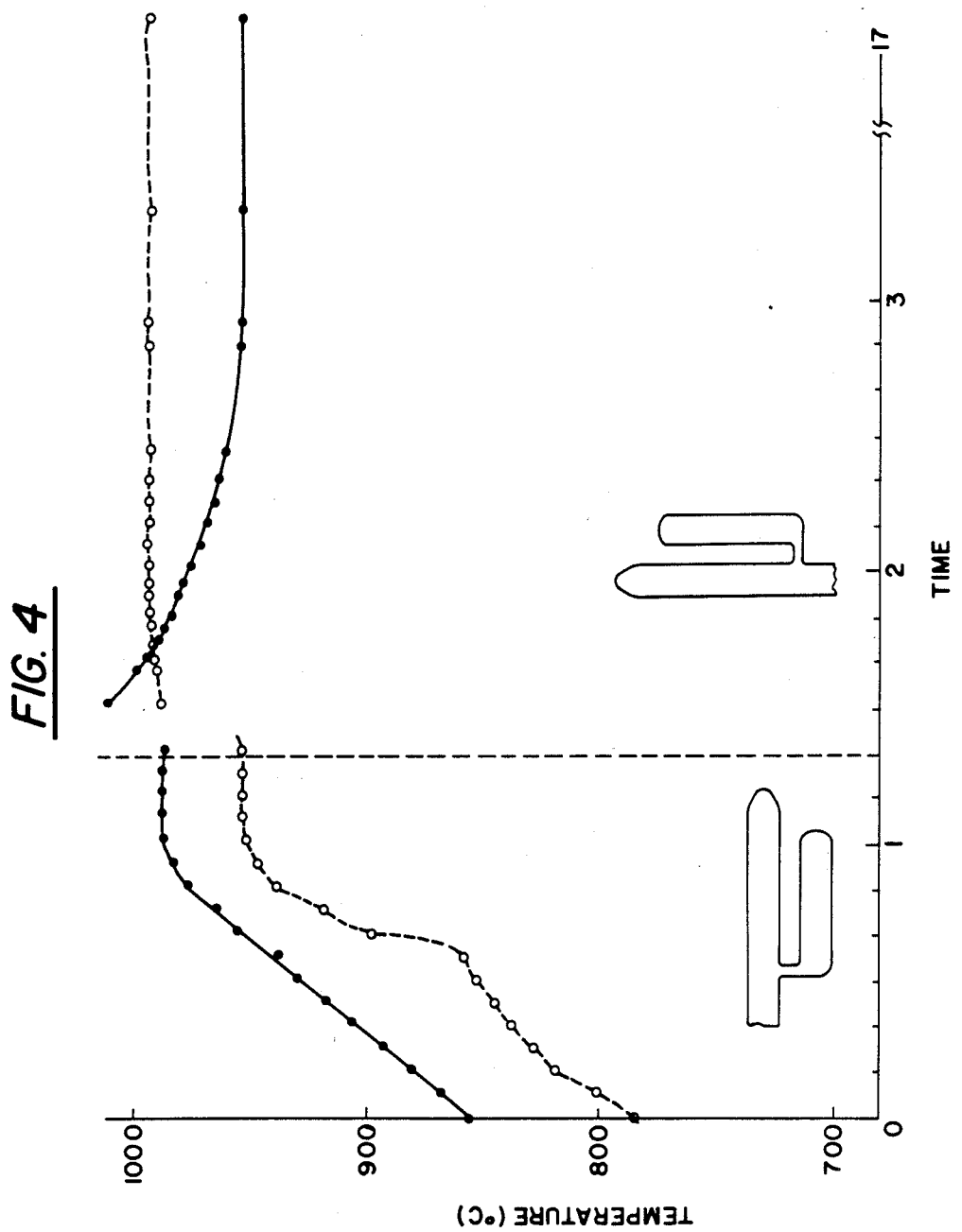

FIG. 4 is a diagram showing the time and the change of temperature in the respective regions of the tiltable growth apparatus according to the present invention which is rendered to the vertical posture after the alloying process.

Figure 5:
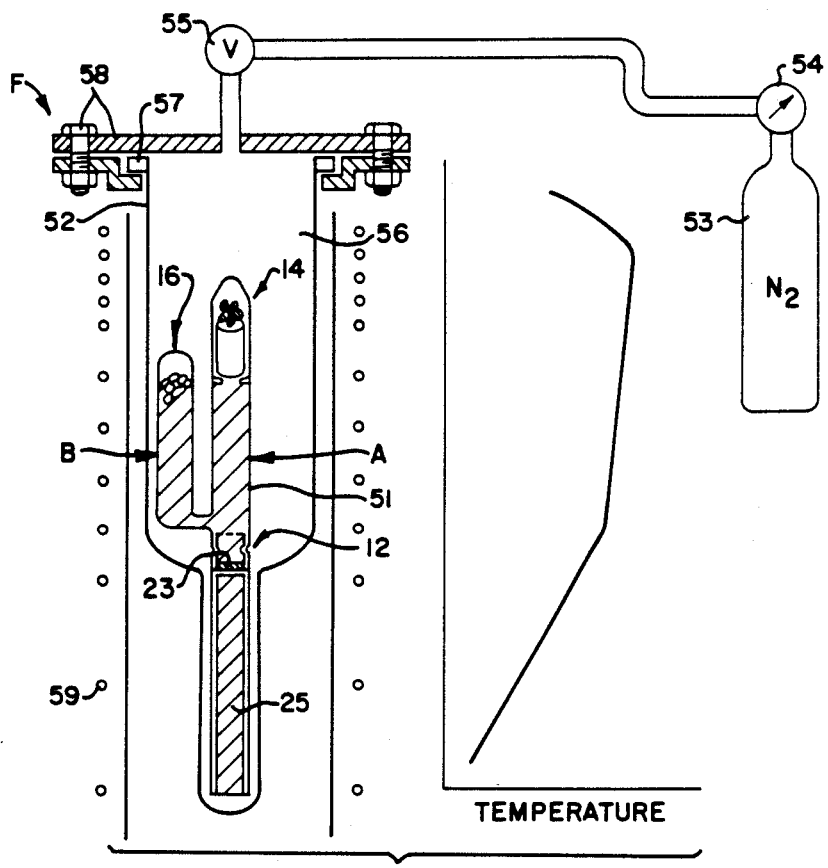

FIG. 5 is a diagram showing another embodiment of the growth apparatus of the present invention wherein a vertical type quartz ampule is set within a pressure-resistant tube.

Figure 6:
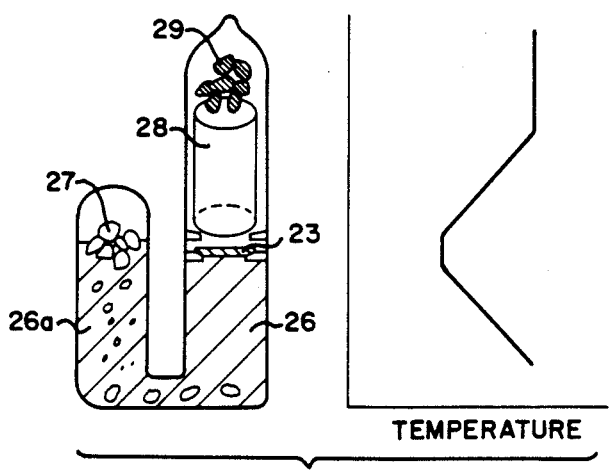

FIG. 6 is a diagram showing another embodiment having a quartz structure different from that shown in FIG. 2.

DETAILED DESCRIPTION OF THE PREFERRED EMBODIMENTS

An embodiment of the growth apparatus structure employed in the present invention is shown in FIG. 2. This growth apparatus, basically, is the vertical-type. In the crystal growth region 12 of a closed quartz ampule generally indicated by A, there is placed a ZnSe substrate 23 which is secured in place by, for example, a quartz ring 24 to prevent the substrate 23 from moving upwardly from its placed position or from causing any other displacement. In order to insure that the heat will flow out uniformly downwardly from the entire area of the bottom surface of the substrate 23, both the upper side 22a and the bottom side 22b of the ampule A are finished to have mirror faces which are parallel with each other. A heat sink 25 made of, for example, carbon is inserted at the bottom side 22b of the ampule A. This ampule is so structured that a vapor pressure controlling region 14 is provided right above the growth region 12 via a Se melt region containing a batch of Se melt 26. A batch of Zn 29 is charged in the vapor pressure controlling region 14 to supply Zn vapor onto the Se melt 26 throughout the growth process to thereby minimize the deviation from stoichiometry of the substrate 23 and the crystal layer being grown. The batch of Se melt 26 and the batch of Zn 29 are positioned with the intervention, therebetween, of a spacer 28 made of, for example, quartz to effectively provide thermal isolation between these two regions 26 and 29.

A closed quartz ampule B branches off horizontally from an appropriate site of said vertical type ampule A, and in this embodiment shown in FIG. 2, this ampule B stems out horizontally at a site between the growth region 12 and the vapor pressure controlling region 14 of the ampule A so as to communicate with the Se melt region 26 thereof. This branched ampule B contains a batch of Se melt 26a and ZnSe source crystals 27. Thus, this branch ampule B serves as a source crystal region 16. Molecules of ZnSe are transported horizontally from this source crystal region 16 to be supplied into the ZnSe melt 26 located above the growth region 12. This transportation of the Se molecules takes place by virtue of the temperature gradient which is formed vertically from the melt 26 to the substrate 23, and as a result, a growth is realized.

The quartz ampule B containing the source crystals is shown in FIG. 2 as having a vertically extending shape. It should be noted, however, that this ampule B only requires to have the function to supply ZnSe molecules laterally into the melt 16. Therefore, the configuration of the ampule B is not limited to that illustrated. These two quartz ampules A and B have their own diameters and dimensions which are determined by taking into consideration the amounts of Se charged therein, respectively. It should be noted, however, that in case the growth temperature is elevated, this will result in a rise of the Se vapor pressure. Therefore, in order to increase the mechanical strength of the quartz tubes, the ampules desirably have small diameters.

Description will hereunder be made briefly of an instance wherein a growth is performed by the use of a growth apparatus comprising a growth ampule and a plurality of such source crystal regions as the one mentioned above.

An n-type ZnSe crystal is determined of its crystal orientation by X-ray analysis, and a slice having a (111) face or a (100) face both having an orientation error of ±2° is cut out. The slice thus obtained has a diameter of 6 to 8 mm and a thickness of about 500 μm. This slice of crystal is subjected to lapping, followed by mirror face finishing. After cleaning the resulting slice, it is etched with, for example, Br-methanol, and the resulting slice is used as a substrate. This slice is set in the growth region of a quartz ampule A having an inner diameter of about 6 mm and a thickness of about 2 mm. In the Se melt is introduced Li to effect a growth of a p-type layer.

In case an epitaxial growth is to be performed, it should be noted that, unlike the instance wherein a large-size crystal is grown in a relatively short time to obtain a single crystal ingot, it is the aim of the epitaxial growth to obtain a growth layer of a thickness of about 10 to 20 μm having a good crystal perfection. Accordingly, the proportion or balance of the growth conditions such as the growth temperature, the temperature difference and the growth time becomes important.

In the present invention, source crystals are supplied laterally, and accordingly there is the advantage represented by a good linearity of the thickness of the growth layer relative to time.

The required temperature difference is given by the use of any known heating means such as heating coil provided around the respective furnace tubes, though not illustrated excepting for FIG. 5.

Also, the relation between the growth time and the thickness of the grown layer obtained by the growth process using the substrate prepared under the above-mentioned conditions is shown in FIG. 3. The growth temperature in this instance is set at 1000° C., and the growth rate obtained is about 2.2 μm/hour.

In case no heat sink is provided, the flow of heat passes mainly along the outer wall of the quartz tube, resulting in that the growth layer exhibits a thickness which is greater at the peripheral portions of the substrate crystal. However, in case a carbon rod serving as a heat sink is connected immediately beneath the crystal substrate as stated above, the flow of heat travels successfully uniformly toward just below the depositing crystal, and also the thickness of the grown layer becomes uniform.

Also, in order to reduce the heat treatment time prior to a growth, it is effective to charge, into the ampule, a preliminarily prepared batch of crushed alloy of Se solvent and ZnSe crystals. If, however, it is possible to conduct alloying within the growth ampule, the trouble of making preliminary preparation of the alloy and crushing it can be saved, and also the risk of possible contamination of the material can be avoided. To this end, it is only necessary to construct the growth furnace including the ampule so as to have a tiltable structure. This furnace is positioned in its horizontal posture during the process of alloying Se and ZnSe source crystals, while keeping the growth region at a temperature somewhat higher than the temperature of the source crystal region. By so arranging, alloying can be accomplished without causing the crystal substrate to dissolve in Se. At the stage that, at the end of alloying for several hours, the ZnSe crystals have sufficiently dissolved in the Se melt, and that the melt has become a saturated solution, the furnace is held upright, and the temperature of the growth region is rendered to a level lower than the temperature of the source crystal region, thus entering into the growth process.

The time and the change in the temperatures of the crystal substrate and the Zn vapor controlling region when the alloying process and the growing process are timewisely locked to each other by inclining or rotating the growth apparatus as stated above, are shown in FIG. 4. The dash circle lines refer to the Zn vapor control region and the solid dot line refer to the ZnSe substrate. To the left of the vertical dash line is the alloying process, on the right the growth process.

The schematical diagram of the growth apparatus as a whole and an example of temperature distribution are shown in FIG. 5. It will be noted in FIG. 5 that a quartz ampule 51 containing a growth region 12, a source crystal region 16, a ZnSe crystal substrate 23, a vapor pressure controlling region 14 and a carbon heat sink 25 is placed in a pressure-resistant tube 52 which is made of either quartz or a ceramics material such as $Al_2O_3$. By using such a structure, it will be noted that, in case the growth temperature used leads to a vapor pressure which exceeds the mechanical strength of the quartz ampule, there can be introduced an inert gas such as $N_2$ or Ar into the pressure-resistant tube 5. In FIG. 5, reference numeral 53 represents an inert gas container; 54 pressure regulating means; 55 stop valve means; 56 a highly-pressurized gas; 57 collar; 58 a flange assembly; 59 heating coil; and F fastening means.

By relying on the above-mentioned growth process and using the above-described growth apparatus, a ZnSe crystal was epitaxially grown under the conditions: a growth temperature of 950° C., a Zn chamber temperature of 1000° C., a temperature difference of 20° C., and a growth time of several hours. The ZnSe crystal was subjected to cleavage for microscopic observation. The growth layer was found to have a uniform distribution of thickness of 20 μm.

The growth temperature, desirably, is set at a further lower level. Some examples of the growth temperature relative to the temperature of Zn are enumerated as follows.

|  | Growth temperature | Optimum temperature of Zn | Range |
|---|---|---|---|
| For: | $T_g$ = 950° C. | $T_{zn}$ = 1025° C. | (1000~1050° C.) |
|  | $T_g$ = 900° C. | $T_{zn}$ = 996° C. | ( 980~1020° C.) |
|  | $T_g$ = 850° C. | $T_{zn}$ = 965° C. | ( 950~1000° C.) |
|  | $T_g$ = 800° C. | $T_{zn}$ = 935° C. | ( 900~ 980° C.) |
|  | $T_g$ = 750° C. | $T_{zn}$ = 904° C. | ( 850~ 920° C.) |

The above table shows optimum temperatures for respective growth temperatures. However, the ranges of temperature shown in the parentheses can give a crystal having a good crystal perfection.

As for the temperature difference, a growth can be accomplished if the difference is in the range of 5° C.~100° C. Since the growth rate lowers progressively for lower growth temperatures, it becomes necessary to set the difference at a large value. For example, at 900° C. of growth temperature, the temperature difference many be within 20°~30° C. At 750° C., however, a temperature difference of 50° C. or more is desirable.

The growth time is determined in connection with the growth rate. At a growth temperature of 900° C. or higher, a growth time of about 3 hours is sufficient. At a temperature level lower than that, a growth time of about 5 to 10 hours is required.

With respect to the thickness of the grown layer, a desired thickness in the range of 0.1~100 μm can be obtained easily by controlling the growth temperature, the temperature difference and the growth time.

In order to have Zn vapor pressure act effectively upon the crystal substrate, it is desirable to use a structure such that the growth region be located at a site between the vapor controlling region and the source crystal region. FIG. 6 shows another embodiment of the quartz ampule according to the present invention in which the abovesaid aspect is taken into consideration. Although this embodiment has the drawbacks that there is difficulty in taking a temperature distribution and that no heat sink can be provided, it will be understood that, if there is employed some means to improve the temperature distribution, this latter embodiment will be effective from the viewpoint of crystal perfection of the grown crystal.

As discussed above, the present invention has the advantage that it is possible to obtain an epitaxial growth layer of ZnSe having a uniform thickness distribution and a good crystal perfection, and thus it can widely contribute industrially to the manufacture, by solution growth, of blue light emitting diodes using ZnSe.

What is claimed is:

1. A tiltable apparatus for epitaxially growing a ZnSe crystal from a melt thereof, comprising:
    a vertical first vacuum quartz ampule region containing a batch of Se melt and a ZnSe source crystal in an upper portion of this melt;
    a second vertical vacuum quartz ampule region containing a batch of Se melt; a ZnSe crystal substrate supported on a bottom portion of said second ampule region on which a ZnSe crystal is to be deposited through said Se melt; a Zn vapor pressure controlling region containing a solid Zn element in a top portion in said second ampule region to supply a controlled vapor pressure of the Zn to said Se melt; and a thermally insulating spacer means intervening between said Se melt and said Zn,
    heat sink means connected to said bottom portion of said second ampule region and causing heat to flow out from said apparatus at a bottom surface of said second ampule region, said heat sink means being constituted by a body that is integral with said second ampule region,
    said bottom portion of said first quartz ampule region horizontally communicating with said second quartz ampule region at a side portion of said second quartz ampule region between said bottom portion and said Zn vapor pressure controlling region to allow a saturated solution of said ZnSe source crystal to be transported into said Se melt in said second ampule region by virtue of a temperature difference between the first and the second ampules region; and
    means for establishing said temperature difference.

2. A tiltable apparatus according to claim 1, in which:
    the bottom of said second ampule on which the substrate is supported has a mirror-faced upper surface.

3. A tiltable apparatus according to claim 1, in which:
    said first and second ampules are communicatingly connected by a horizontal quartz tube which is integral with both the first and second quartz ampules at a site of the second ampule corresponding to the region wherein said Se melt is contained.

4. A tiltable apparatus according to claim 1, in which:
    said means for establishing said temperature difference includes heating coils wound around said first and second ampules.

5. A tiltable apparatus for epitaxially growing a ZnSe crystal from a melt thereof, comprising:
    a first vertical vacuum quartz ampule region containing a batch of Se melt and a ZnSe source crystal in an upper portion of said melt;
    a second vertical vacuum quartz ampule region containing a batch of Se melt; a ZnSe crystal substrate provided with a region for causing a ZnSe crystal to be epitaxially grown through said Se melt in a lower portion of said melt; a Zn vapor pressure controlling region provided in an upper portion of said second ampule region to supply Zn vapor pressure to said Se melt of said second ampule region; and a thermally insulating spacer region intervening between said Zn vapor pressure controlling region and said Se melt in said second ampule region,
    said first ampule region being horizontally connected to said second ampule region between said ZnSe crystal substrate and said Zn vapor pressure controlling region of said second ampule region;
    said ZnSe crystal being moved into said Se melt in said second ampule region for growth by virtue of a temperature difference between said first and second ampule regions;
    said second ampule region being provided with a portion to flow out heat generated during the crystal growth from a bottom surface of said second ampule region;
    a flanged quartz tube capable of being used at high temperatures and for reducing a pressure difference between said first and second ampule regions, surrounding the whole of said first and second ampule regions;
    a gas supply for applying pressure to a space between said first and second ampule regions and said quartz tube with an inert gas such as $N_2$ or Ar;
    a stainless steel flange for connecting said quartz tube with said gas supply; and
    a heating source for heating said first and second ampule regions from the outside of said quartz tube.

6. A tiltable apparatus for epitaxially growing a ZnSe crystal from a melt thereof, comprising:
    a first vertical vacuum quartz ampule region containing a batch of Se melt and a ZnSe source crystal in an upper portion of said melt;
    a second vertical vacuum quartz ampule region containing a batch of Se melt; a ZnSe crystal substrate for causing a ZnSe crystal to be epitaxially grown through said Se melt in an upper portion of said melt; a Zn vapor pressure controlling region provided in an upper portion of said second ampule region to supply Zn vapor pressure to said ZnSe crystal substrate; and a thermally insulating spacer region intervening between said Zn vapor pressure controlling region and said ZnSe crystal substrate, said first and second ampule regions being horizontally connected with each other at the bottom thereof so that said ZnSe source crystal is also provided in said second ampule region; and a heating source bringing about such temperature distribution that the temperature of a ZnSe source crystal provided in the upper portion of said first ampule region is lower than that in the lower portion of said first ampule region so that Zn vapor pressure control is performed through a temperature difference.

* * * * *